US006516014B1

United States Patent
Sellin et al.

(12) 
(10) Patent No.: US 6,516,014 B1
(45) Date of Patent: Feb. 4, 2003

(54) PROGRAMMABLE FREQUENCY REFERENCE FOR LASER FREQUENCY STABILIZATION, AND ARBITRARY OPTICAL CLOCK GENERATOR, USING PERSISTENT SPECTRAL HOLE BURNING

(75) Inventors: Peter B. Sellin, Bozeman, MT (US); Nicholas M. Strickland, Lower Hut (NZ); John L. Carlsten, Bozeman, MT (US); Rufus L. Cone, Bozeman, MT (US)

(73) Assignee: The Research and Development Institute, Inc., Bozeman, MT (US)

( * ) Notice: Subject to any disclaimer, the term of this patent is extended or adjusted under 35 U.S.C. 154(b) by 0 days.

(21) Appl. No.: 09/831,306
(22) PCT Filed: Nov. 12, 1999
(86) PCT No.: PCT/US99/27026
§ 371 (c)(1), (2), (4) Date: Aug. 21, 2001
(87) PCT Pub. No.: WO00/30225
PCT Pub. Date: May 25, 2000

Related U.S. Application Data
(60) Provisional application No. 60/108,447, filed on Nov. 13, 1998.

(51) Int. Cl.[7] ................................................ H01S 3/13
(52) U.S. Cl. .................... 372/32; 372/29.02; 372/26; 372/18
(58) Field of Search ................................ 372/32, 29.02, 372/26, 28, 18

(56) References Cited

FOREIGN PATENT DOCUMENTS
JP 03-151681 6/1991

OTHER PUBLICATIONS
"Photochemical Holes as Stable References for Frequency Locking Lasers", by Macfarlane, IBM Technical Disclosure Bulletin, vol. 23, No. 6(Nov. 1980), pp. 2515–2516.
"Laser Phase and Frequency Stabilization using an Optical Resonator", by Drever et al., Applied Physics B (Photophysics and Laser Chemistry), vol. B31, No. 2 (Jun. 1983), pp. 97–105.
"Short and Long Term Stability of Optical Oscillators", by Zhu et al., Proceedings of the 1992 IEEE Frequency Control Symposium, Hershey, PA (May 27–29, 1992), pp. 44–55.
"Programmable Frequency Reference for Subkilohertz Laser Stabilization by Use of Persistent Spectral Hole Burning", by Sellin et al., Optics Letters, vol. 24, No. 15 (Aug. 1999), pp. 1038–1040.

*Primary Examiner*—Leon Scott, Jr.
(74) *Attorney, Agent, or Firm*—McDermott, Will & Emery

(57) ABSTRACT

Techniques for stabilizing a laser (110) at a selectable frequency include splitting an output beam from an electrically adjustable laser into a first beam (369) and a second beam (361). The second beam is transmitted through a modulator (112). Then the second beam is transmitted through a spectral hole burning material (310) onto a detector (120). The laser is electronically adjusted in response to a detector output from the detector which senses the changes in the modulated second beam after it passes through the spectral hole burning material.

22 Claims, 10 Drawing Sheets

PROGRAMMABLE FREQUENCY REFERENCE FOR LASER FREQUENCY STABILIZATION, AND ARBITRARY OPTICAL CLOCK GENERATOR, USING PERSISTENT SPECTRAL HOLE BURNING

This application claims the benefit of Provisional Application No. 60/108,447, filed Nov. 13, 1998.

BACKGROUND

1. Field of the Invention

This application is related to stabilizing the frequency of a tunable laser and, more particularly, to using spectral hole burning materials to stabilize the frequency of a tunable laser.

2. Description of the Related Art

Lasers emit electromagnetic radiation characterized by the optical range of the spectrum where wavelengths are expressed in nanometers (nm) corresponding to $10^{-9}$ m, and frequencies are expressed in megaHertz (MHz) corresponding to $10^6$ Hz, or gigaHertz (GHz) corresponding to $10^9$ Hz, or teraHertz (THz) corresponding to $10^{12}$ Hz, where one Hz is one cycle per second.

Previous laser stabilization techniques have relied on frequency references based on Fabry-Perot interferometer resonances or the center frequencies of transitions in atomic or molecular vapors.

In the prior art, for example, the Pound-Drever-Hall laser frequency locking technique (R. W. P. Drever, J. L. Hall, F. V. Kowalski, J. Hough, G. M. Ford, A. J. Munley, and H. Ward, *Laser Phase and Frequency Stabilization Using an Optical Resonator*, Appl. Phys. B31, 97 (1983), M. Zhu and J. L. Hall, *Stabilization of optical phase/frequency of a laser system: application to a commercial dye laser with an external stabilizer*, J. Opt. Soc. Am. B 10, 802 (1993)) utilizes frequency modulated (FM) spectroscopy techniques (G. C. Bjorklund, M. D. Levenson, W. Lenth, C. Ortiz, *Frequency Modulation (FM) Spectroscopy: Theory of Lineshapes and Signal-to-Noise Analysis*, Appl. Phys. B 32, 145 (1983)) to actively lock the laser frequency to a reflection mode of a Fabry-Perot interferometer.

Use of an error signal to stabilize a laser frequency of a tunable laser according to the Pound-Drever-Hall technique is shown in FIG. 1. In FIG. 1A a laser 110 emits a beam along path 161 impinging on a phase modulator 112 The radio frequency (rf) signal generator 142 supplies an electrical signal transmitted by wire to the modulator 112 and to mixer 140. The modulator 112 phase modulates and passes a first beam portion along path 162 to a beam splitter 114. Beam splitter 114 passes a second beam portion along a beam path 163 to a cavity 116 between mirrors 115 and 117. The cavity 116 is tuned to a reference frequency by choice of spacing between mirrors 115 and 117 and the cavity emits a reference beam having an energy peak at the reference frequency along path 163 to splitter 114. At beam splitter 114 both the modulated beam, which reflects immediately off mirror 115, and the reference beam are diverted along path 165 to a detector 120 which outputs a detector electrical signal. The detector reference signal contains rf frequency components generated by the interference between the modulated beam and the cavity reference beam. This detector electrical signal is filtered at filter 130 to remove unwanted harmonic frequencies and to generate an error signal that is output to the mixer 140. At mixer 140 the rf signal from the rf signal generator 142 is combined with the error signal at rf frequencies to demodulate the error signal to lower frequencies where it is used as a control signal that is output to the laser servo electronics 150. The servo electronics 150 tune the laser 110 in response to the control signal received.

FIG. 1B shows the output 125 of cavity transmission detector B 122 and the error signal 145 output by error signal detector A 120 combined with the mixer 140 which is sent to the servo electronics 150 as the modulated laser frequency beam 162 is tuned across the cavity reference frequency. The amplitude of the error signal 145 at a given frequency in the vicinity of the lock point 147 is related to the size and direction of the deviation of frequency from the reference frequency at the lock point 147. Thus the greater the deviation of the laser frequency from the reference frequency, the greater is the error signal and the greater is a component of the input to the servo electronics 150 to tune the laser back toward the reference frequency at the lock point 147. The stability of the laser frequency is limited by the characteristics of the peak in the cavity transmission signal used as the reference frequency detected by the detector 120.

To evaluate locking stability, two lasers are locked to adjacent modes of the same cavity. The beat signal between the two laser frequencies is then monitored for fluctuations. A relative locking performance of 1 part in $10^5$ of the interferometer linewidth has been recently demonstrated (G. Ruoso, R. Storz, S. Seel, S. Schiller, J. Mlynek, *Nd: YAG laser frequency stabilization to a supercavity at the 0.1 Hz level*, Opt. Comm. 133, 259 (1997)) with a high finesse interferometer cavity having a resonance linewidth of less than 10 kHz, leading to relative stability between two lasers at the sub-Hz level for nominally a minute. The short-term drift of the frequency of either of these lasers arises from thermal length changes, mechanical creep, vibration, or other variation in the length of the reference cavity and hence resonance frequency. A recent notable attempt to approach absolute stability used Fabry-Perot cavities made from sapphire and kept at cryogenic temperatures to achieve a 3 kHz drift over 6 months (R. Storz, C. Braxmaier, K. Jäck, O. Pradl, S. Schiller, *Ultrahigh long-term dimensional stability of a sapphire cryogenic optical resonator*, Opt. Lett. 23, 1031 (1998)).

Atomic transitions are commonly used to lock a laser to a specific, absolute frequency. A typical arrangement would substitute a fixed atomic resonance for the cavity resonance and allow the modulated beam to transmit through a gas-phase sample before collecting it on a photodetector. Today's precision clocks and oscillators are based on well-studied microwave transition frequencies of rubidium, cesium, hydrogen and mercury atoms in oscillators and masers. Optical frequency standards in the communications bands of 1.3 and 1.5 micron wavelength are also of interest. Among the principal advantages and difficulties with existing microwave and optical standards are that the transition frequencies of an atom are unique to its type, i.e. predetermined by nature, with consequent limitations on the choice of frequency, and that FM locking techniques typically select the center of those transitions. If the frequencies are not exactly those of interest, they must be transferred through an elaborate chain of precisely controlled optical and radio frequency (RF) synthesis, such as frequency doubling and mixing or parametric oscillation sums and differences. Lastly, strong optical dipole transitions typically have spectral linewidths in the 10's of MHz (megaHertz, i.e., $10^6$ Hz)—not especially narrow for use as a precise frequency discriminator for laser locking, though examples of higher multi-pole moment transitions with narrower linewidths do exist.

Another frequency locking technique involves stabilization to a Lamb dip in a gas vapor cell. For the Lamb dip, the gaseous motion of the atoms produces a Doppler shifted distribution of frequencies creating an inhomogeneously broadened absorption-line. A strong laser, intense enough to saturate a particular velocity subset of these atoms can temporarily create a spectral hole anywhere in the absorption profile until it is turned off and the hole disappears (absorption reappears). A less intense probe laser can be locked to the hole created in the presence of the strong laser. The frequency stability of the Lamb dip spectral hole is determined by that of the strong laser. To remove this external stability dependence, the more typical arrangement is to use a single laser divided into two counter-propagating beams, strong and weak. For a lock to occur, the two beams must interact with the same velocity subset of atoms that must be the non-Doppler shifted subset. The lock is then constrained to the center of the inhomogeneous absorption.

Condensed phase spectral hole burning materials are known. Absorption features of ions or molecules doped into condensed phase materials are spectrally broadened by two main classes of mechanisms. Homogeneous broadening is the fundamental broadening experienced by all ions or molecules independently, and arises from the quantum-mechanical relationship between the lineshape and the dephasing time of the excited ion. At cryogenic temperatures, such homogeneous linewidths have been measured, using the photon-echo technique, to be as narrow as 100 Hz or less, orders of magnitude sharper than most gas phase transitions (R. W. Equall, Y. Sun, R. L. Cone, R. M. Macfarlane, *Ultraslow Optical Dephasing in $Eu^{3+}:Y_2SiO_5$*, Phys. Rev. Lett. 72, 2179 (1994)). Inhomogeneous broadening, such as that of the inhomogeneous absorption profile 210 depicted in FIG. 2A, arises from the overlap of the quasi-continuum of individual spectra 220 of all of the ions or molecules in the condensed phase material, which have microscopically different environments and therefore slightly different transition frequencies. The extent of this envelope can be anywhere from hundreds of MHz to the THz (teraHertz, i.e., millions of MHz) range.

Spectral hole burning (W. E. Moerner, ed., *Persistent Spectral Hole Burning: Science and Applications*, (Springer-Verlag, Berlin 1988); R. M. Macfarlane and R. M. Shelby, "Coherent Transient and Spectral Holeburning Spectroscopy of Rare Earth Ions in Solids," in *Spectroscopy of Solids Containing Rare Earth Tons*, A. A. Kaplyanskii and R. M. Macfarlane, eds. (North Holland, Amsterdam 1987)) uses a narrow-band laser to selectively excite only the small fraction of ions or molecules whose frequencies around a central frequency 240 coincide with that of the laser. If some mechanism exists to remove those ions or molecules from the absorbing population, or to change their resonant frequencies, then the inhomogeneous absorption profile can be temporarily or permanently altered, leaving a "spectral hole" 250 at the frequency of the laser, as seen in FIG. 2B depicting the altered inhomogeneous absorption profile 230. In the cases of interest here, the homogeneous linewidth 220''' is many orders of magnitude smaller than the inhomogeneous linewidth 210, and by probing with a tunable laser in the vicinity of a spectral hole, a sharp positive transmission peak is observed on a broad background of partial transmission. A very flexible advantage of hole burning, in contrast to isolated atomic transitions, is that the center frequency 240 for the hole may be chosen anywhere within the wide inhomogeneous band of absorbing frequencies. Furthermore, multiple holes may be placed within one inhomogeneously broadened absorption band.

Mechanisms exist to provide permanent change to preserve the hole, the most common being (a) excitation-induced changes in the lattice near the optically active ion or molecule, (b) photoionization of that ion or molecule itself, and (c) photochemical reactions. Possibilities exist to use photon-gated processes where a second, possibly broadband, light source is required to produce a persistent hole. With such a process, a single probe laser can be used to read the hole without altering it through further hole burning.

As described above, the frequency locking achievable using Fabry Perot cavities, as shown in FIG. 1A, is limited by the thermal length changes, mechanical creep, vibration and other variations in the length of the reference cavity influenced by external causes. As also described above, the frequency locking achievable using atomic transitions are limited by available central frequencies associated with those transitions and the characteristics of the frequency reference such as the Lamb dip. Thus there is a need for laser frequency stabilization techniques capable of achieving smaller variations in frequency for longer periods of time at more flexibly selected frequencies than are available in the prior art.

SUMMARY OF THE INVENTION

An object of the present invention is to link together the existing techniques of Pound-Drever-Hall type laser frequency locking and persistent spectral hole burning in condensed phase materials to create a laser frequency locking scheme with the potential to stabilize the frequency of a laser on a longer time scale and with a greater accuracy than with existing techniques. The processes for producing each of these techniques are specialized subjects, and the two have not been previously combined.

In the prior art Pound-Hall-Drever laser frequency locking scheme, the resonant modes of a high-finesse Fabry-Perot interferometer are used as a frequency reference for stabilizing a laser. One embodiment of the present invention, however, uses a preprogrammed spectral hole in the absorption profile of a spectral hole burning material (SHBM). As with locking to a gas-phase atomic transition, this provides the potential for high stability over long time periods since the resonance of an ion or molecule in a condensed phase material is fixed for a known temperature. Furthermore, with spectral hole burning done at cryogenic temperatures, the potential exists for extremely sharp resonances.

Unlike with gas phase transitions, locking frequencies can be chosen anywhere within a much broader inhomogeneous absorption profile. In addition, several lasers can be stabilized to multiple spectral holes within the same SHBM with arbitrary frequency separations. This gives rise to programmable and extremely stable beat frequencies between these lasers for such applications as optical clocks and programmable optical waveform generators.

Persistent spectral hole burning offers distinct advantages over the textbook technique of locking to a Lamb dip in a gas vapor cell. The saturation of vapor is only transient, and the lock point is constrained to the center of the broad inhomogeneous absorption to maintain stability. The primary differences of a persistent spectral hole-burning material are that the holes are potentially permanent and very narrow, the hole frequencies are fixed without requiring the continuing stability of the burning laser, and the locking frequencies are not limited to line-center. Further advantages of frequency locking to a persistent spectral hole are: insensitivity to vibrations (which affect the spacings and frequencies of Fabry Perot cavities); insensitivity to thermal variations of the environment obtained through the high degree of thermal isolation inside a cryostat, an asymptotically vanishing dependence of the hole frequency on temperature as a solid material is chilled nearer to absolute zero, and the ability to produce a compact and transportable setup that does not require the ultra-high vacuum equipment necessitated for atomic ion trap frequency standards.

To achieve the foregoing and other objects and advantages of the present invention, as embodied and broadly described herein, techniques for stabilizing a laser at a selectable frequency include splitting an output beam from an electrically adjustable laser into a first beam and a second beam. The second beam is transmitted through a modulator to produce a modulated second beam. Then the modulated second beam is transmitted through a spectral hole burning material onto a detector. The laser is electronically adjusted in response to a detector output from the detector which senses the changes in the modulated second beam after it passes through the spectral hole burning material.

According to another aspect of the invention, techniques for producing light pulses at a beat frequency include producing a first frequency stabilized laser beam at a first frequency and producing a second frequency stabilized laser beam at a second frequency different from the first frequency by an amount related to the beat frequency. Producing the first frequency stabilized laser beam involves transmitting a first output beam from an electronically adjustable first laser through a first spectral hole burning material with a spectral hole at the first frequency onto a first detector. The first laser is electronically adjusted based on a first frequency difference between the first output beam and the first spectral hole, said first frequency difference analyzed from a first detector output from the first detector. Producing the second frequency stabilized laser beam at a second frequency involves transmitting a second output beam from an electronically adjustable second laser through a second spectral hole burning material with a spectral hole at the second frequency onto a second detector. The second laser is electronically adjusted based on a second frequency difference between the second output beam and the second spectral hole, said second frequency difference analyzed from a second detector output from the second detector. The first and second frequency stabilized laser beams are merged to interfere with each other.

In another embodiment of the invention, the first spectral hole burning material is identical to the second spectral hole burning material. In this case the spectral hole burning material has spectral holes at both the first frequency and the second frequency.

In another aspect of the invention, a spectral hole burning material for use in stabilizing a laser frequency at a target frequency with a target laser line width, has a set of homogeneous absorption lines. A particular line of the set of homogeneous absorption lines has a particular center frequency at the target frequency.

Additional objects, advantages and novel features of the invention will be set forth in part in the description which follows, and in part will become apparent to those skilled in the art upon examination of the following or may be learned by practice of the invention.

BRIEF DESCRIPTION OF THE DRAWINGS

The present invention will be described in an illustrative sense and not by way of limitation with respect to the drawings in which the same elements have the same item number, and in which.

DETAILED DESCRIPTION OF THE INVENTION

Figure 3:
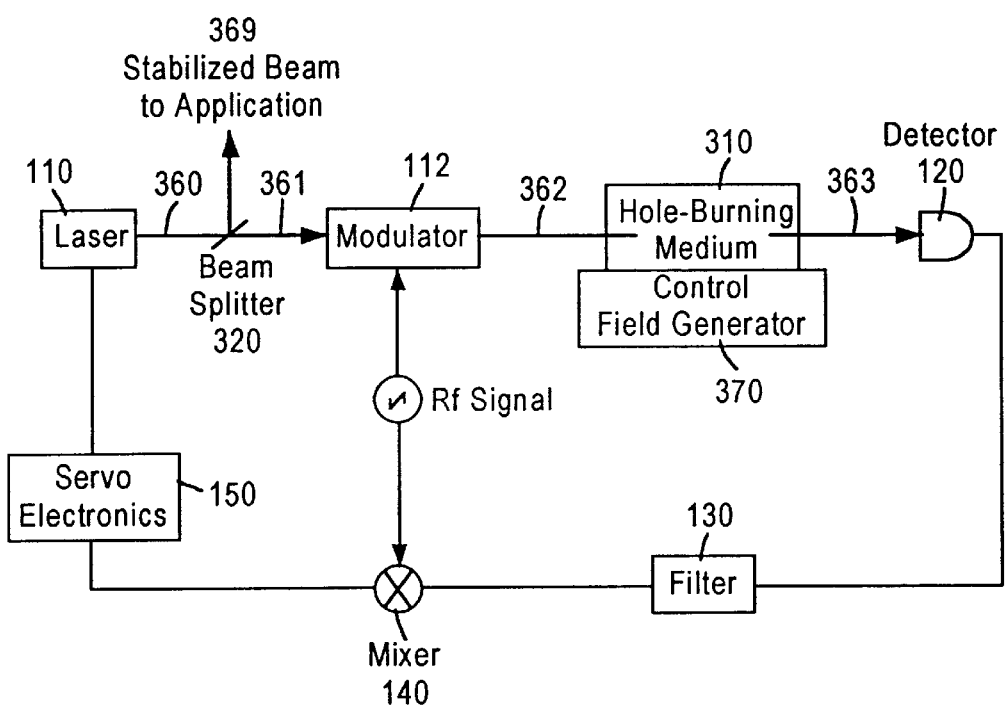
FIG. 3 is a block diagram of an apparatus for locking to a spectral hole according to one embodiment of the present invention.

In the preferred embodiments, a Fabry Perot cavity is eliminated from the stabilization system and instead a beam is transmitted through a SHBM. FIG. 3 shows a configuration of one embodiment. In this embodiment, the output of a tunable laser 110 on path 360 is split at a beam splitter 320 before entering the modulator 112 along path 361. The modulator uses an input rf signal to modulate the phase of the laser output as in FIG. 1A. In the embodiment of FIG. 3, the output from the modulator is directed along path 362 through a SHBM 310. The SHBM was produced with a persistent spectral hole at a desired output frequency and a narrow spectral width. More details on the properties and spectral widths are described below for specific embodiments.

Figure 1A:
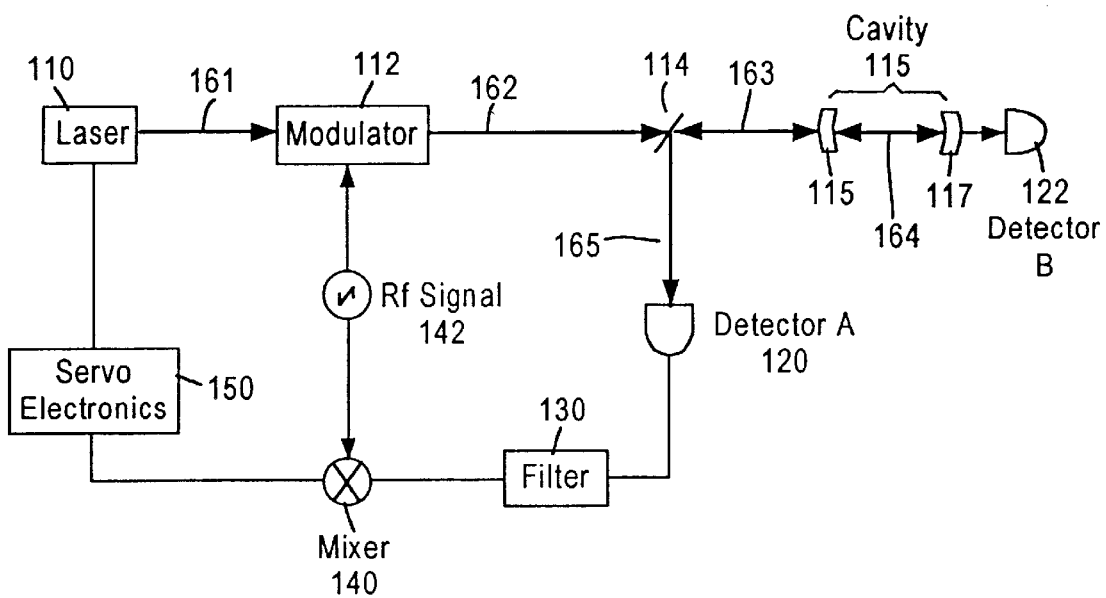
FIG. 1 is a block diagram of an apparatus for stabilizing the frequency of a laser.
Figure 1B:
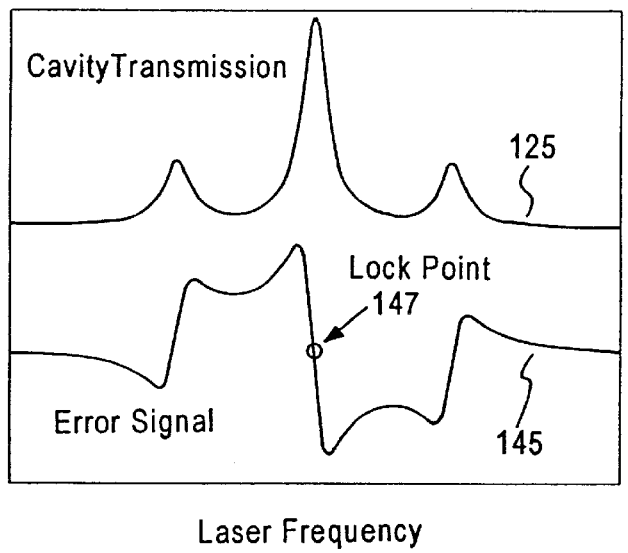
Figure 2A:
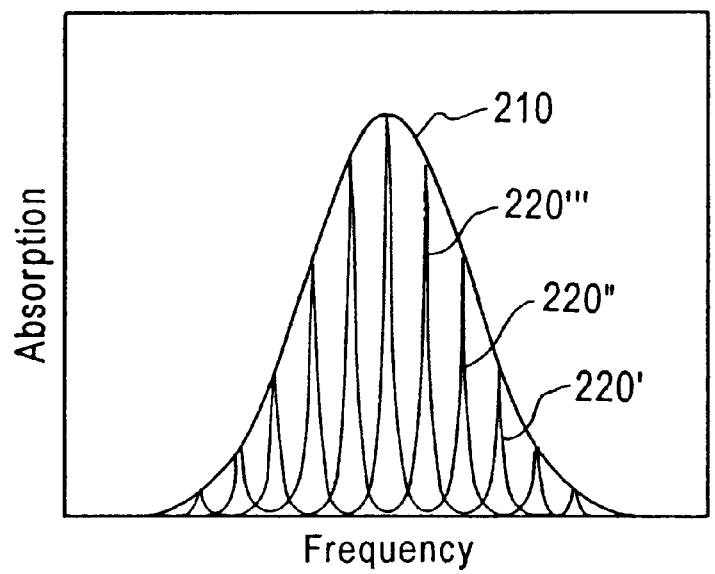
FIG. 2 is a graphical representation of the overlap of homogeneous lines giving an inhomogeneous line broadening in a SHBM and a spectral hole resulting from removal of a subset of ions or molecules by a narrow-band laser.
Figure 2B:
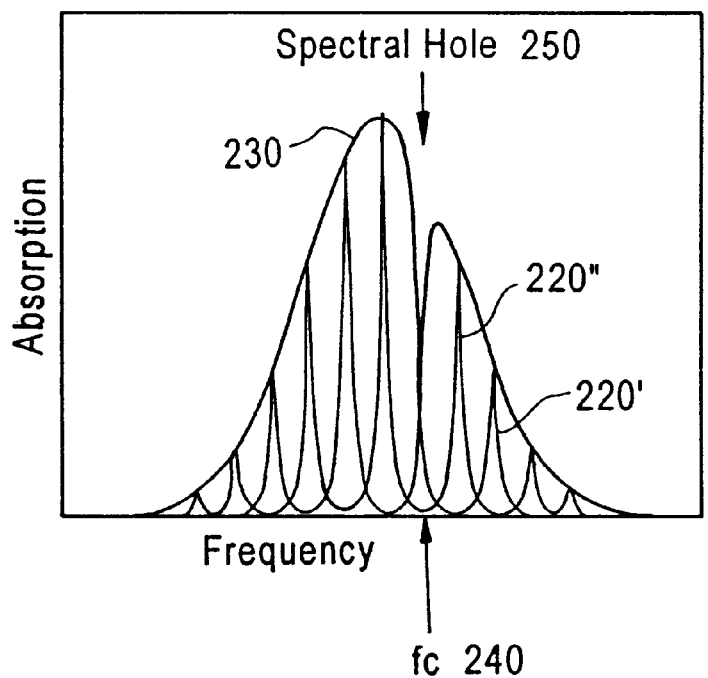

The output from the SHBM 310 is a reference beam, which is detected by the detector 120 like the detector A of FIG. 1A. The control field generator 370 is described later. The remaining elements operate similarly to the previous system described above, but are be selected to have characteristics tailored to the frequency and line width needed for the given application, as described below.

One embodiment of the present invention (P. B. Sellin, N. M. Strickland, J. L. Carlsten, and R. L. Cone, *Programmable frequency reference for subkilohertz laser stabilization by use of persistent spectral hole burning*, Opt. Lett. 24, 1038 (1999)) used a self-constructed external cavity GaAlAs diode laser, which produced approximately 10 milliwatts (mW) of single-mode power manually tunable over the range 792–814 nanometers (nm) (about $10_{15}$ Hertz)). The laser could be tuned quickly (150 MHz per microsecond) over a small frequency range (150 MHz) by adjusting the diode current through a preamplifier and more slowly (1 MHz per microsecond) over a larger range (70 GHz) by tuning the optical prism feedback angle by piezoelectric control.

Figure 4A:
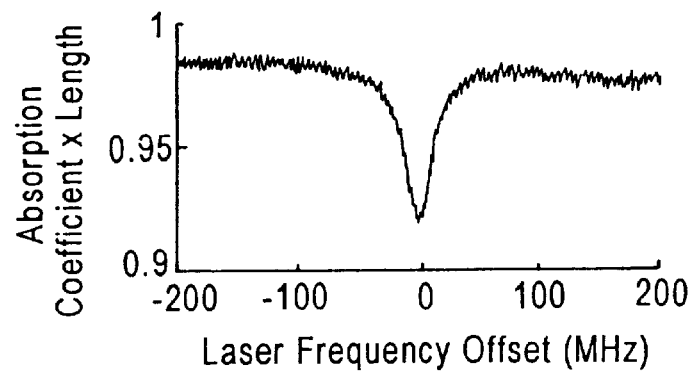
FIG. 4A is a graphical representation of persistent spectral hole in $CaF_2:Tm^{3+}:D^-$, immediately after burning for a material suitable for one embodiment of the present invention.
Figure 4B:
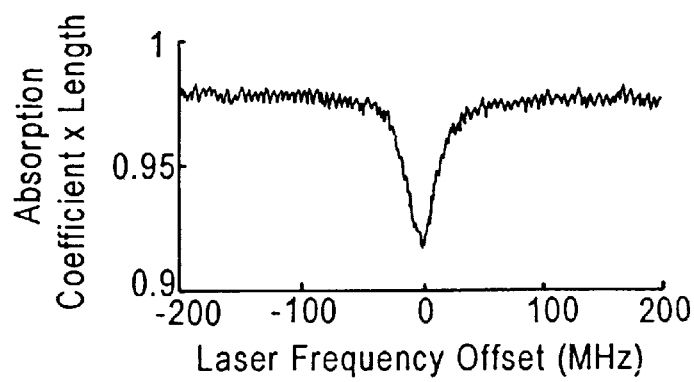
FIG. 4B is a graphical representation of the same persistent spectral hole in of $CaF_2:Tm^{3+}:D^-$, 48 hours later.
Figure 4C:
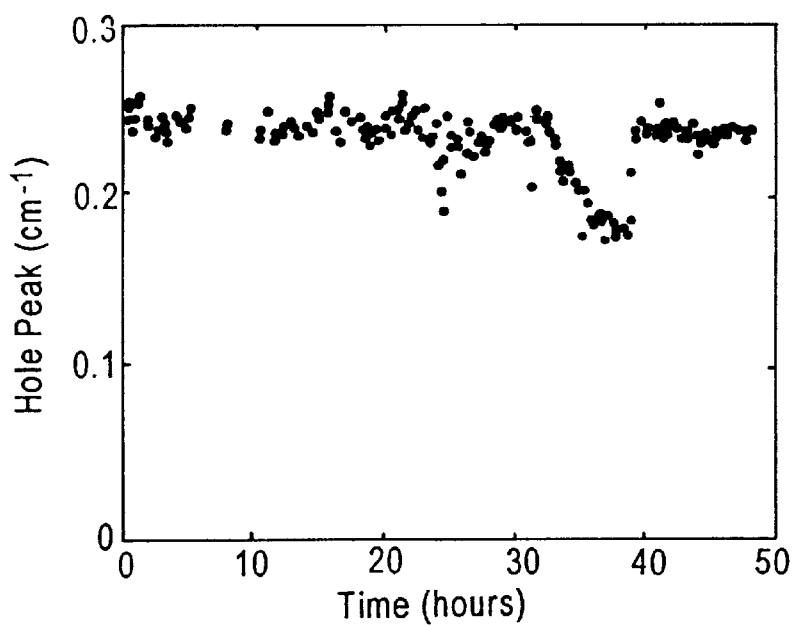
FIG. 4C is a graphical representation of hole depth as a function of time after burning, for persistent spectral hole burning in $CaF_2:Tm^{3+}:D_-$.

The demonstration SHBM was a 2.5 mm thick crystal of $CaF_2:Tm^{3+}$ into which negative deuteride (D_) ions had been diffused, and which had been cooled to 1.9 K with liquid helium. The effect of the deuteride ions is to provide a mechanism for persistent spectral hole burning on optical transitions of the $Tm^3$ ions. Spectral holes in this material have been shown to persist for 48 hours without measurable change. For example, FIG. 4A shows an absorption profile near a spectral hole immediately after burning, and FIG. 4B shows the same spectral hole 48 hours later. FIG. 4C shows that hole peak (given by the reciprocal of hole depth) persists for more than 50 hours. From this evidence, spectral holes are expected to be persistent for a time scale of at least several weeks when maintained at liquid helium temperatures. Any potential limitations of this material over longer time scales are not fundamental to SHBM in general and do not limit the claims of this invention.

Figure 5A:
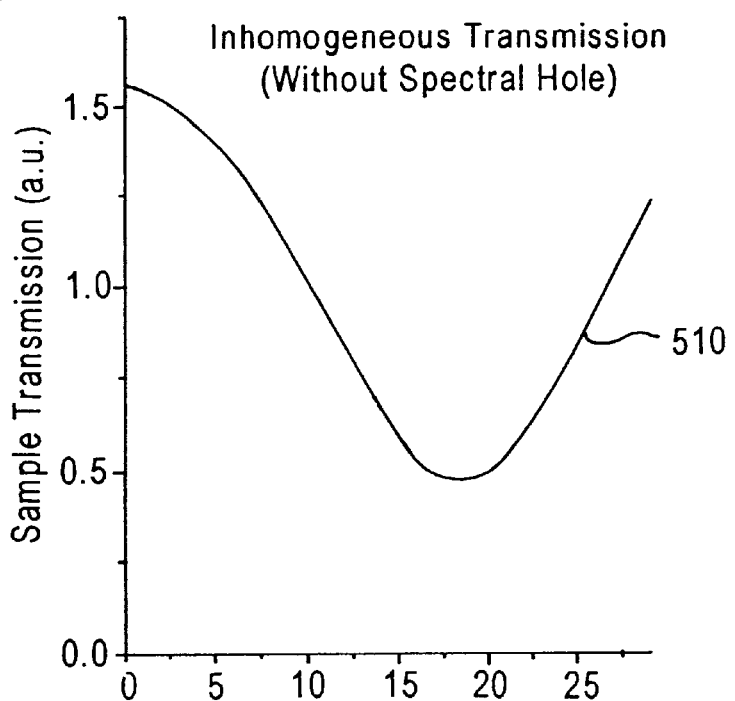
FIG. 5A is a graphical representation of inhomogeneous transmission without a spectral hole.
Figure 5B:
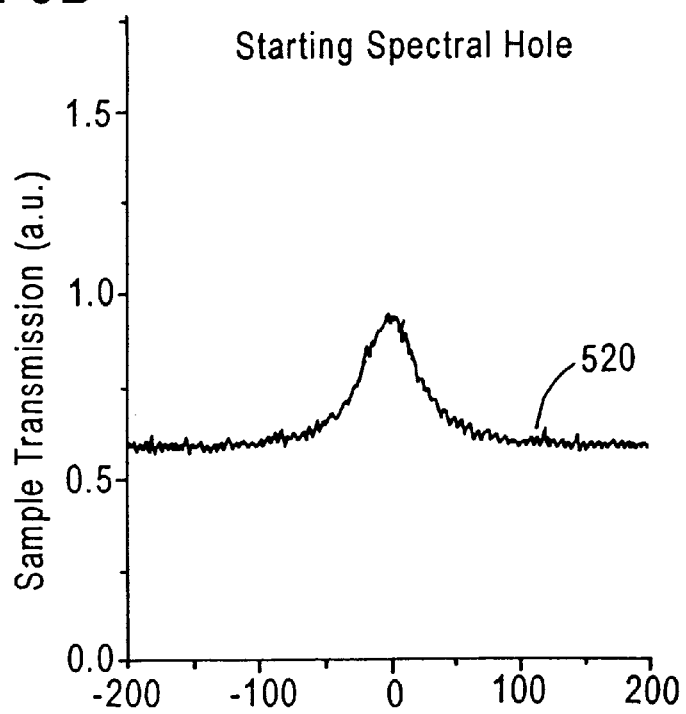
FIG. 5B is a graphical representation of a spectral hole.
Figure 5C:
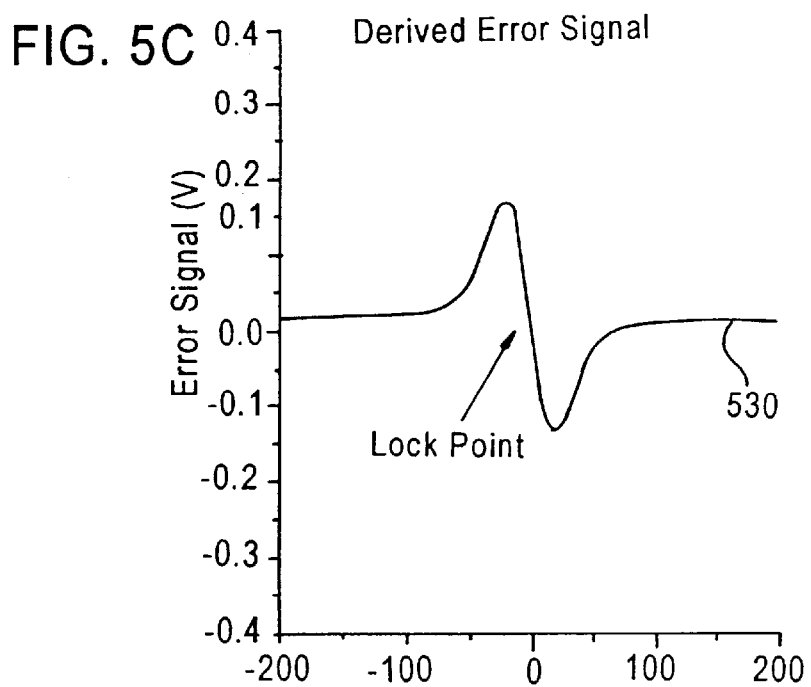
FIG. 5C is a graphical representation of an error signal derived from the spectral hole, according to one embodiment of the present invention.

The SHBM, with a broad inhomogeneous transmission profile 510 shown in FIG. 5A, was exposed to a portion of the unmodulated single-frequency laser beam with approximately 200 microWatts ($\mu W$) of power in a 3 millimeter (mm) diameter for 2 minutes, thus burning a spectral hole at the chosen frequency. To maintain locking, the intensity of the modulated beam with sidebands was reduced by two to three orders of magnitude to minimize further hole burning. The transmission spectrum 520 of the spectral hole and the error signal 530 derived from it are displayed in FIGS. 5B and 5C, respectively.

Servo electronics are built in any manner known in the art to take the error signal derived from the transmission of the modulated laser through the SHBM and provide corrections to the laser tuning elements to lock the laser frequency. In the preferred embodiment, the principal elements are: a mixer to recombine the rf signal to remove the modulation; filters to remove unwanted harmonic frequencies; and two consecutive operational amplifiers, which are configured as lead-compensated integrators, to convert the time-dependent error signal into a corrective voltage. A corner frequency of the first lead compensated integrator was chosen to be approximately one-half of the frequency width of the spectral hole chosen for locking. A corner frequency of the second lead compensated integrator was chosen experimentally to best narrow the laser frequency. The second corner frequency optimizes the relative amounts of control feedback at lower frequencies versus control feedback at higher frequencies and is chosen to minimize the error signal while locked.

Figure 5D:
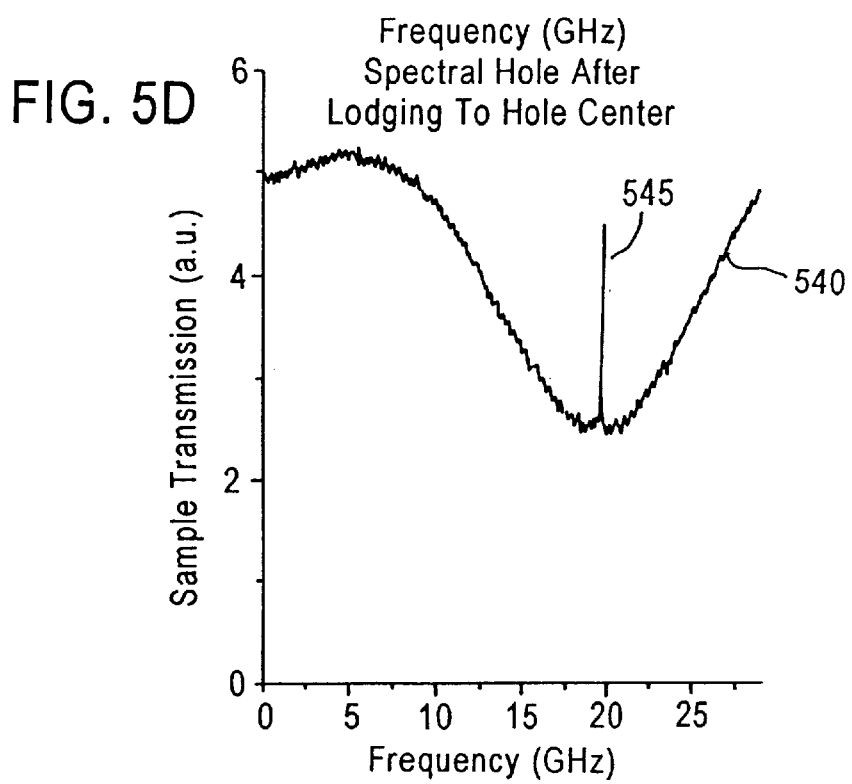
FIG. 5D is a graphical representation of the altered inhomogeneous transmission with a locked spectral hole, according to an embodiment of the present invention.
Figure 5E:
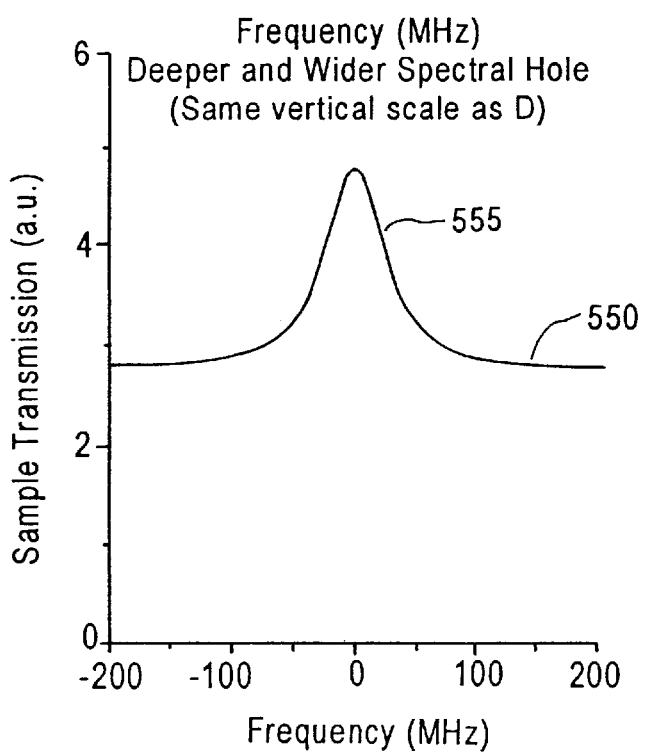
FIG. 5E is a graphical representation at an expanded horizontal scale of the transmission profile in the vicinity of the locked spectral hole according to an embodiment of the present invention.
Figure 5F:
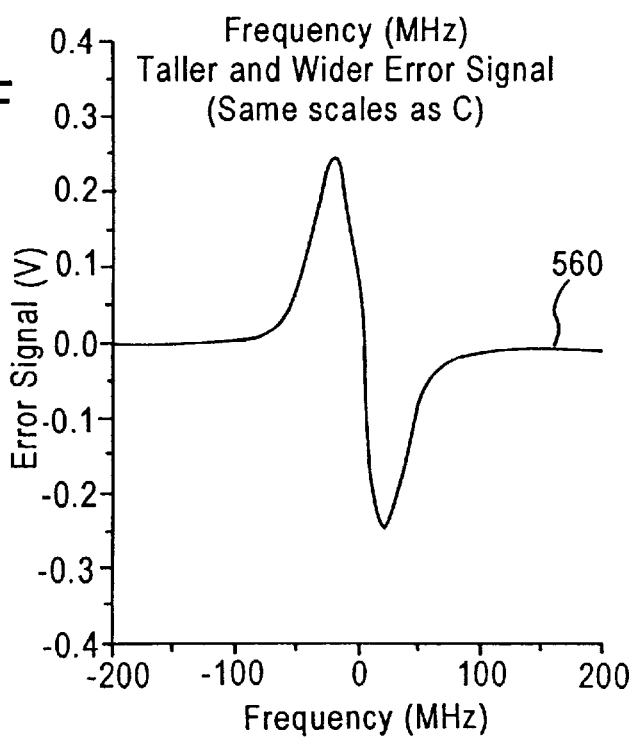
FIG. 5F is a graphical representation at an expanded horizontal scale of the error signal according to an embodiment of the present invention

Once the laser was locked to the SHBM frequency reference, the overall transmission profile 540, shown in FIG. 5D, had a sharp spectral hole 545. This is shown at expanded horizontal side as the transmission profile 550 of the hole 555 in FIG. 5E and the taller error signal 560 in FIG. 5F. When attempts were made to manually change the frequency of the laser by a small amount, the feedback loop altered a second tuning element to keep the laser frequency fixed on the hole peak.

Figure 6A:
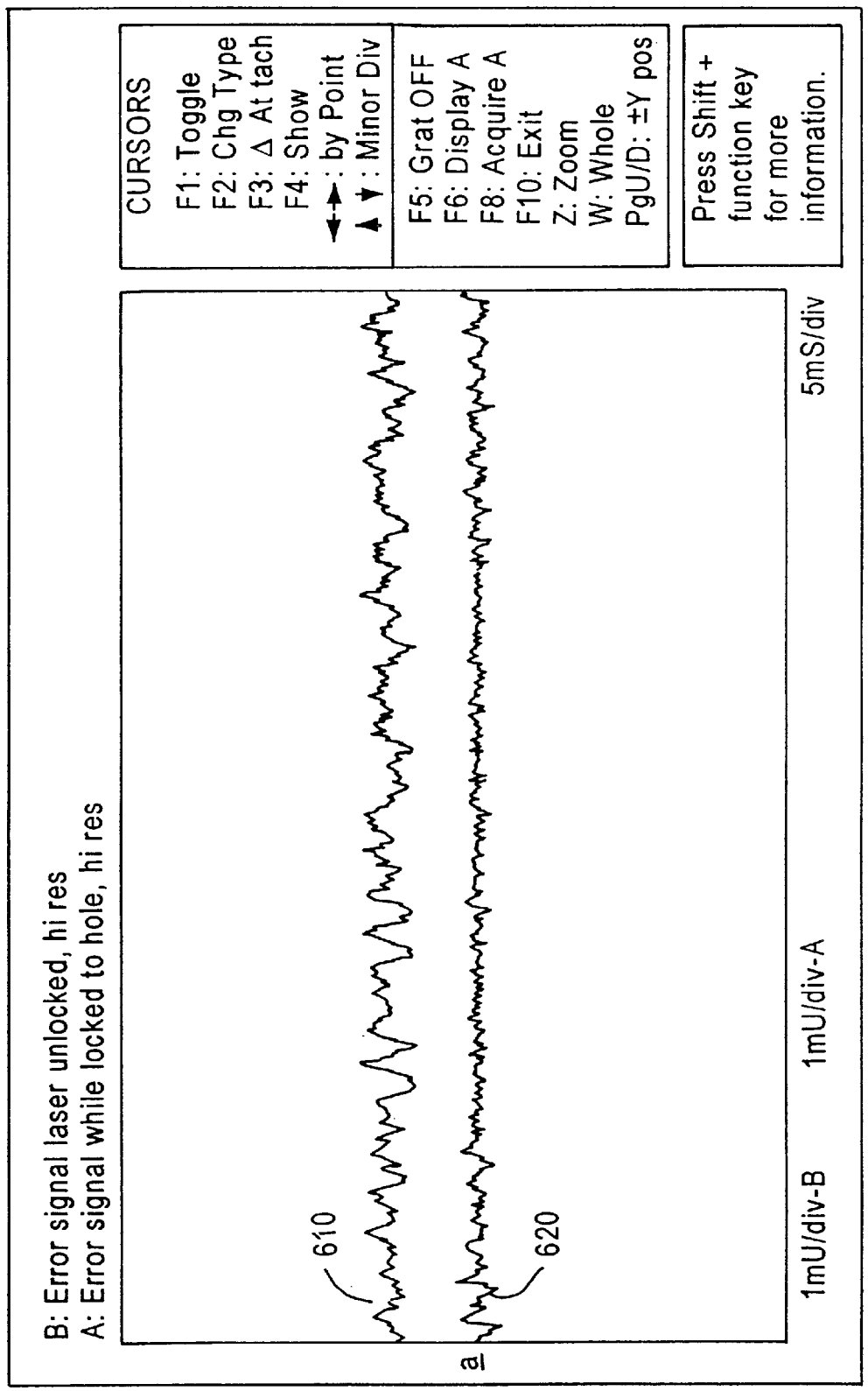
FIG. 6A is a graphical representation of modulation of the error signals due to laser jitter, with the laser free running and with the laser locked according to an embodiment of the present invention.

When the servo loop was inactive, the error signal showed significant short-term noise and medium term drift that was not present when the servo loop was activated. FIG. 6A presents two traces of early data demonstrating a first lock to a persistent spectral hole. The upper trace 610 shows the variation of the detected error signal (and hence the laser's frequency variation) with the laser free running near the center of the spectral hole. During a ten second interval, the laser had slowly drifted 200 kHz lower in frequency, thus raising the error level 1.5 millivolts (mV) from zero. The remaining faster fluctuations show the variation in frequency about its new mean point on a short time scale. The amplitude fluctuations of the lower trace 620 are quieter as the servos act to confine and lock the laser frequency to the central lock point with no average displacement from zero.

Figure 6B:
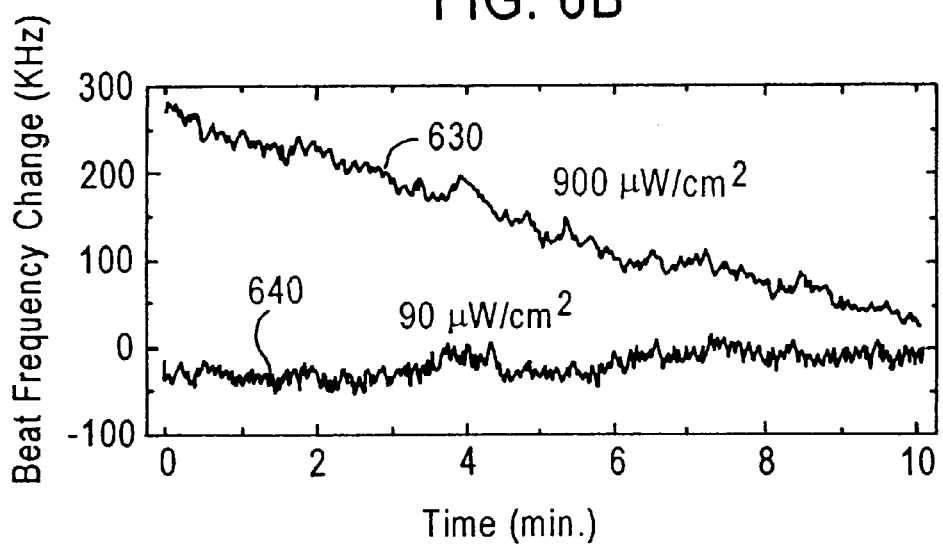
FIG. 6B is a graphical representation of beat frequency as a measure of laser frequency stability according to two additional embodiments of the present invention.

Initially, the locking accuracy was estimated by calibrating to the full range error signal. A more precise measurement has been made by locking two lasers to separate holes, then monitoring the frequency-difference beat signal between the two lasers and its traditional measure of stability, the Allan variance. In another embodiment, two lasers are locked at 798 nm to persistent spectral holes in two separate crystals of deuterated $CaF_2:TM^{3+}$, both cooled to 1.9° K in a single liquid helium cryostat. The beat frequency between these two lasers shows a significant improvement in frequency stability over a wide range of time scales. FIG. 6B shows for curve 630 a 200 kHz change in the beat frequency over 10 minutes while the lasers were locked by spectral holes using a moderate beam intensity of 900 $\mu W/cm^2$. A similar plot (not shown) for the lasers while free running typically shows a drift of 25 MHz in 10 minutes, two orders of magnitude worse than when locked. The residual drift seen in curve 630 is due to continued burning of the spectral hole while locked. If the laser is locked with a slight frequency shift from the center of the hole, then continued off-center burning will cause the lock frequency to move. By reducing the laser intensity the burning rate and hence the drift rate is reduced, as shown for curve 640. However, the reduced signal to noise ratio results in a trade-off in the short term stability for this crystal system. In other embodiments this trade-off is reduced by using a larger sample of the SHBM with a larger area to maintain a low irradiance, power per unit area ($W/m^2$), to reduce further burning yet increase the total power (W) and signal available for locking.

Figure 6C:
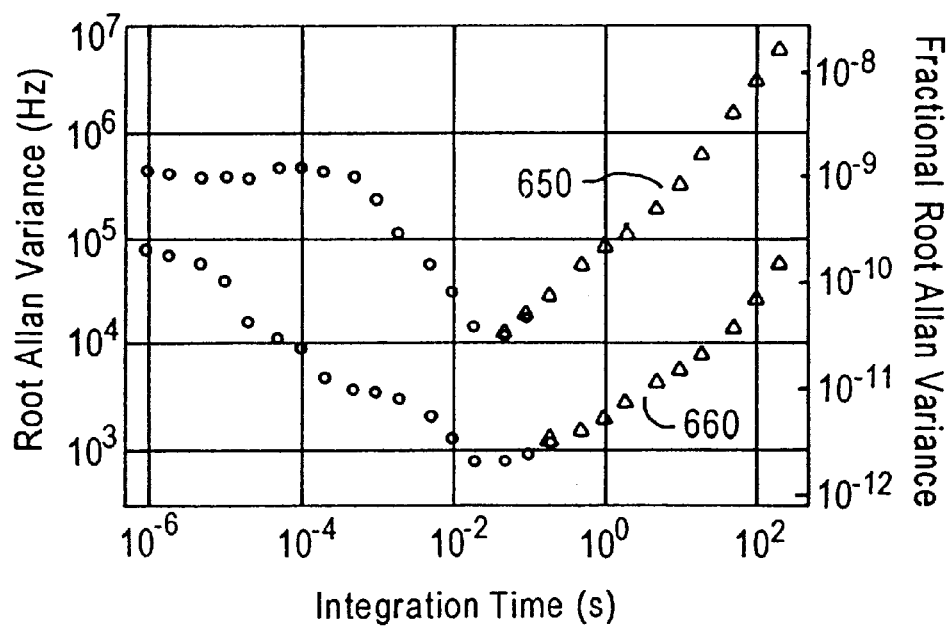
FIG. 6C is a graphical representation of Allan variance as a measure of laser frequency stability according to one embodiment of the present invention.

The Allan variance of a frequency signal is a measure of its stability over a range of time scales. The Allan variance of the beat signal between the two lasers when locked to spectral holes and when free-running is depicted in FIG. 6C. This figure demonstrates that one to two orders of magnitude in stabilization relative to the free-running (unlocked) lasers are achieved by locking to the persistent spectral holes. On time scales of around 20 to 50 milliseconds (ms) stabilization to 780±120 Hz have been achieved. This is 3 parts in $10_{-5}$ of the width of the spectral holes (over 25 MHz). More recent results demonstrate that the hole width is the limiting factor in this case. This is not a fundamental limit for this device, because other spectral hole burning materials used for some other embodiments have narrower hole widths.

Although illustrative embodiments of this invention have been described, it is understood that numerous variations may be made in accordance with the principles of this invention. Such variations would include, changes to the wavelength and type of laser to be stabilized, the spectral hole burning medium to be used for stabilization, and the method for converting the transmitted laser signal into a means to correct the laser frequency. The initial performance demonstrated here should not be regarded as indicative of the ultimate capability of the invention.

The process described is general. Many substitutions could be made for existing components. The choice of a particular SHBM or combinations of SHBMs can provide customized frequencies and hole widths. The requirements for cooling the SHBM might also be relaxed, though this will almost always increase the hole width and therefore reduce the locking performance. However, this relaxed temperature requirement would be particularly important if temperatures available from closed cycle cryostats yield sufficiently narrow holes for the required application, removing liquid helium consumption and refilling needs.

The working example described above used deuterated $CaF_2$:$Tm^{3+}$ as the SHBM for frequency stabilization at 798 nm. Other materials are selected to suit the wavelength required in other embodiments. In particular, locking is accomplished at 1523 nm with $CaF_2$:$Er^{3+}$:$D^-$. This wavelength is of particular interest for telecommunications, where frequency stabilization is an important aspect of Wavelength Division Multiplexing (WDM) and other implementations.

Improved performance results from a material with a narrower homogeneous line width. Extremely narrow homogeneous line widths in the region of 100 Hz have been measured in $Y_2SiO_5$:$Eu^{3+}$, and with this material exhibiting persistent spectral hole burning, a very high degree of stability on the order of 1 milliHz could be achieved.

For long term stabilization, gated hole burning materials may be preferred. In gate hole burning, the laser does not cause any permanent change unless some other control conditions simultaneously exist represented by control field generator 370 in FIG. 3. The most common form of gating is photon gating, where a second intense light source (usually, but not necessarily, a second laser) must illuminate the SHBM simultaneously with the hole burning laser to enable hole burning. In the absence of the gating beam, the spectral profile may be probed by the read laser without altering the depth or profile of existing holes. Materials exhibiting photon-gated spectral hole burning include $Y_3Al_5O_{12}$:$Pr^{3+}$, BaClF:$Sm^{2+}$ and BaClF:$Eu^{2+}$.

Any single-frequency, continuous wave laser of the correct wavelength to match a SHBM response may be used. The small tunability required to lock to the resonance can be achieved in a number of ways, including but not limited to the use of a intracavity electro-optic element, a piezo-electrically adjustable mirror or any other tuning mechanism of the laser.

Different locking techniques can also be used as alternatives to the PoundDrever-Hall scheme described here. Use of alternate locking techniques should be considered part of this invention.

The stability of the lock is improved by a bootstrapping process in another embodiment to narrow the hole used for a reference. If a material is chosen with a sufficiently narrow resonance, then the width of the spectral hole may be degraded, e.g., broadened in frequency, by the laser frequency variability present when originally burning the hole. In this case, a tighter lock may be achieved by locking, then burning a new hole at a new spatial location or new frequency and transferring the lock to the new hole. Successively tighter locks can be achieved until the limit of the material is reached.

A new frequency for the second lock is generated in several ways in these embodiments. For example, a new frequency is generated in one embodiment by splitting a portion of the beam, and shifting its frequency with an acousto-optic modulator, or by adding additional, more widely spaced, phase-modulated sidebands to the original beam with an electro-optic phase modulator.

If the initial shallow hole is broader in frequency than twice the homogeneous linewidth, then the locked laser can continue to burn at the center frequency of the hole, causing a sharper peak until a hole width of approximately twice the homogeneous linewidth is reached.

If a laser with feedback electronics is simply incident on the SHBM without spectral holes, then a hole will be burned leading to a self-stabilizing lock condition.

The ultimate limit for the locked laser linewidth will be the SchawlowTownes, or instantaneous, linewidth of the laser, a parameter determined by the laser design. We estimate this to be in the sub-millihz region for the diode lasers considered here, though our invention is not confined to that type of laser or to that specific numerical performance limit. The stability achieved using embodiments of our invention can be as small as $10_{-5}$ of a homogeneous line width, as described above, or smaller.

Figure 7A:
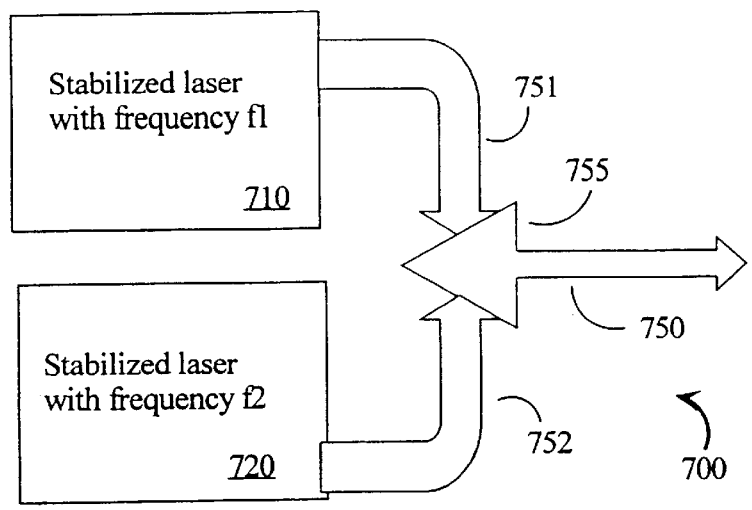
FIG. 7A is a block diagram of an optical clock according to one embodiment of another aspect of the present invention.
Figure 7B:
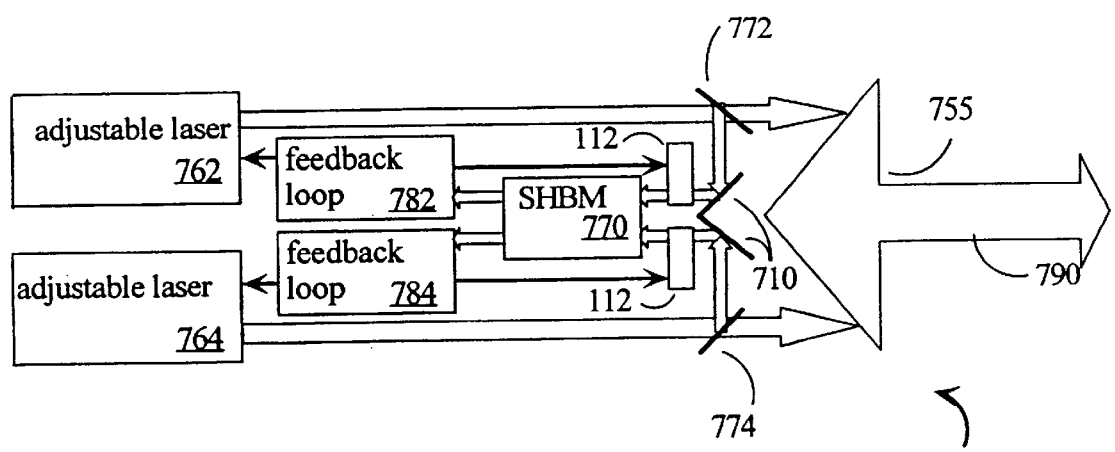
FIG. 7B is a block diagram of an optical clock according to another embodiment of the other aspect of the present invention.

With the hole burning scheme for frequency locking, two or more lasers (e.g., 710 and 720 in FIG. 7A) can be locked with arbitrary frequency separations, provided that the inhomogeneous absorption profile is sufficiently broad or that multiple absorption lines exist in the SHBM or combination of SHBMs. The beat frequency (e.g., on beam path 750 in FIG. 7A) between such lasers can be used as an optical clock generator 700 with a user-determined clock frequency. If wider-spaced lasers are desired for a higher-frequency beat signal, for example, two separate hole burning transitions could be used, either in two (or more) transitions of a single SHBM, or in combinations of ions or molecules in a single SHMB or multiple SHBMs. FIG. 7B illustrates a clock 799 using a single SHBM 770. In this embodiment, the one SHBM 770 is used with splitter 772 and feedback loop 782 to control laser 762, and with splitter 774 and feedback loop 784 to control laser 764. In FIG. 7B, the each of the feedback loop boxes 782 and 784 represent any elements, such as those in FIG. 3, needed to lock the laser frequency other than those shown explicitly in FIG. 7B. As an example, by double doping $Er^{3+}$ and $Tm^{3+}$ into a single $CaF_2$ crystal (770) one could lock one laser (e.g. 762 in FIG. 7B) at 798 nm, and another laser (e.g. 764) at 1523 nm, giving a beat frequency (e.g. on path 790) of 180 THz.

Other embodiments produce a laser locked to a tunable frequency reference. With a spectral hole in a suitable SHBM this is achieved by application of an external magnetic or electric field produced by the control field generator 370 in FIG. 3. The respective Zeeman and Stark effects can cause a reversible change in the resonant frequency of the hole, and the locking mechanism will keep the laser tracking with this change. Multiple holes burned within the same inhomogeneous line will tune approximately together. If spectral holes within different transitions in a single SHBM are used, then these may tune at different rates, giving the possibility of tuning the beat frequency between two locked lasers. For implementation of tunable spectral holes, the choice of host material, dopant, and external field directions are made to prevent (or alternatively to induce) complex hole splittings and non-linear tuning.

Examples of applications that would benefit from, or even require, the short-term and long-term frequency stabilization provided by the present invention are described next.

In optical communication systems one often needs sources and receivers at remote locations with identical stabilized frequencies, long term stability, and matched narrow band optical filters.

Wavelength-division multiplexing (WDM) is an existing technology whereby several optical signals are transmitted simultaneously via a single optical fiber. The individual signals are transmitted at different frequencies, allowing them to be distinguished at the receiver using narrow band filtering. The typical advanced systems used for these signals are separated in frequency by 50 GHz. The present invention would allow more bands with smaller frequency separations to be carried by one of these fibers.

Implementations in other contexts of narrower channel spacings to handle a far greater number of independent but lower bandwidth channels currently suffer from the problem of long-term frequency drift. The stabilization provided by the present invention reduces the practical frequency spacing by many orders of magnitude, while also providing the long-term stability required to ensure that the receiver's discriminator remains in tune with the transmitter. This technology is also useful in many other situations as disparate as optical satellite links and computer interconnects.

Large-scale interferometry, such as has been proposed for the detection of gravity waves, is an application, which requires high frequency stability. The size of an interferometer is limited by the coherence length of a laser beam, which in turn is directly related to the frequency stability of the laser. For example, an existing commercially-available laser with frequency stabilized to 1 MHz has a coherence length of 300 m, whereas a laser stabilized to the Hertz level would have a coherence length of $3 \times 10^8$ m. The latter is the length scale required for proposed Earth-orbit based gravity wave interferometers and is potentially achievable with some embodiments according to the present invention.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense. The spirit and scope of the invention is defined in the appended claims and their equivalents.

What is claimed is:

1. A method for stabilizing a laser at a selectable frequency, the method comprising the steps of:
    splitting an output beam from an electrically adjustable laser into a first beam and a second beam;
    transmitting the second beam through a modulator;
    after transmitting the second beam through the modulator, transmitting the second beam through a spectral hole burning material onto a detector; and
    electronically adjusting the laser in response to a detector output from the detector.

2. The method of claim 1, wherein
    the modulator is controlled by an rf signal; and
    the step of electronically adjusting the laser further comprises
        computing an error signal from the detector output,
        mixing the error signal with the rf signal to produce a mixed signal, and
        inputting the mixed signal to servo electronics for controlling properties of the electronically adjustable laser, wherein said properties affect a frequency of the laser beam.

3. The method of claim 1, further comprising the step of initially transmitting a hole-burning beam through the spectral hole burning material.

4. The method of claim 3, wherein:
    the hole-burning beam is the second beam; and
    an initial intensity of the second beam during the step of initially transmitting is greater than an operating intensity during said transmitting the second beam through a spectral hole burning material.

5. The method of claim 3, further comprising applying a hole-burning control field to the spectral hole burning material during said initially transmitting a hole-burning beam.

6. The method of claim 5, wherein the hole burning control field is a third beam of light.

7. The method of claim 5, wherein the hole burning control field is an electric field.

8. The method of claim 5, wherein the hole burning control field is a magnetic field.

9. The method of claim 3, further comprising the step of burning a second spectral hole in a second spectral hole burning material with a portion of the first beam, wherein the first beam has been stabilized to a narrower spectral width using the first hole burning material.

10. The method of claim 1, further comprising the step of composing the spectral hole burning material to have a homogeneous absorption line at each selectable frequency of a set of selectable frequencies before said transmitting the second beam through a spectral hole burning material.

11. The method of claim 10, before the step of transmitting the second beam through a spectral hole burning material, further comprising the step of initially adjusting said electronically adjustable laser to produce an output beam with an output frequency closer in frequency to a selected frequency of the set of selectable frequencies than to any other homogeneous absorption line of the spectral hole burning material.

12. A method for producing light pulses at a beat frequency, the method comprising the steps of:
    producing a first frequency stabilized laser beam at a first frequency, said step of producing the first frequency stabilized laser beam including
        transmitting a first output beam from an electronically adjustable first laser through a first spectral hole burning material with a spectral hole at the first frequency onto a first detector, and
        electronically adjusting the first laser based on a first frequency difference between the first output beam and the first spectral hole, said first frequency difference analyzed from a first detector output from the first detector;
    producing a second frequency stabilized laser beam at a second frequency different from the first frequency by an amount related to the beat frequency, said step of producing the second frequency stabilized laser beam including transmitting a second output beam from an electronically adjustable second laser through a second spectral hole burning material with a spectral hole at the second frequency onto a second detector, and electronically adjusting the second laser based on a second frequency difference between the second output beam and the second spectral hole, said second frequency difference analyzed from a second detector output from the second detector; and merging the first and second frequency stabilized laser beams to interfere with each other.

13. The method of claim 12, wherein the first spectral hole burning material is identical to the second spectral hole burning material.

14. The method of claim 12, wherein the first spectral hole burning material is different than the second spectral hole burning material.

15. The method of claim 12, wherein the beat frequency is in the regime of TeraHertz radiation.

16. A method for producing light pulses at a beat frequency, the method comprising the steps of:

producing a set of more than two frequency stabilized beams having a corresponding set of target frequencies, the set of target frequencies selected to produce a predetermined beat pattern, wherein producing each beam of the set of more than two frequency stabilized beams comprises transmitting an output beam from an electronically adjustable laser through a spectral hole burning material with a spectral hole at a corresponding frequency of the set of target frequencies onto a detector, and electronically adjusting the laser based on a frequency difference between the output beam and the spectral hole, said frequency difference analyzed from a detector output from the detector; and merging the set of more than two frequency stabilized beams to interfere with each other.

17. A spectral hole burning material for stabilizing a laser frequency at a target frequency with a target laser line width, wherein said material has a set of homogeneous absorption lines;

a particular line of said set of homogeneous absorption lines has a particular center frequency at the target frequency.

18. The spectral hole burning material of claim 17, wherein the particular line has a particular spectral hole line width; and the particular spectral hole line width is in a range from about the target laser line width to about 100,000 times the target laser line width.

19. A system for producing a laser beam locked at a selectable frequency with a laser line width, the system comprising:

an electrically adjustable laser producing an output beam with an output beam frequency;

a splitter for splitting the output beam into a first beam and a second beam on a second beam axis;

a modulator on the second beam axis for applying a radio frequency signal to modulate a frequency of the second beam;

a spectral hole burning material on the second beam axis after said modulator for transmitting a reference beam on a reference beam axis, said spectral hole burning material subject to forming a homogeneous spectral hole at the selectable frequency;

a detector on the reference beam axis for producing a detector signal related to the reference beam; and servo electronics for electronically adjusting the output beam frequency based on a difference between the radio frequency signal and the detector signal.

20. A clock for producing light pulses at a beat frequency, the clock comprising:

an electrically adjustable first laser producing a first output beam with an first output beam frequency on a first output beam axis;

a first spectral hole burning material on the first beam axis for transmitting a first reference beam on a first reference beam axis, said first spectral hole burning material subject to forming a homogeneous spectral hole at a first selectable frequency;

a first detector on the first reference beam axis for producing a first detector signal related to the reference beam;

first servo electronics for electronically adjusting the first output beam frequency based on a difference between a frequency of the first output beam and the first detector signal;

an electrically adjustable second laser producing a second output beam with a second output beam frequency on a second output beam axis;

a second spectral hole burning material on the second beam axis for transmitting a second reference beam on a second reference beam axis, said second spectral hole burning material subject to forming a homogeneous spectral hole at a second selectable frequency different from the first selectable frequency by the beat frequency;

a second detector on the second reference beam axis for producing a second detector signal related to the reference beam;

second servo electronics for electronically adjusting the second output beam frequency based on a difference between the second output beam frequency and the second detector signal; and a optical joint for combining the first output beam with the second output beam.

21. The clock of claim 20, wherein the first spectral hole burning material is identical to the second spectral hole burning material.

22. The clock of claim 20, wherein the first spectral hole burning material is different than the second spectral hole burning material.

* * * * *

UNITED STATES PATENT AND TRADEMARK OFFICE
CERTIFICATE OF CORRECTION

PATENT NO.    : 6,516,014 B1
DATED         : February 4, 2003
INVENTOR(S)   : Sellin et al.

It is certified that error appears in the above-identified patent and that said Letters Patent is hereby corrected as shown below:

Column 1,
Line 9, please insert, after the first paragraph and before the "Background" section,

-- GOVERNMENT SUPPORT

This invention was made with government support under grant number F49620-96-1-0466 awarded by the United States Air Force, United States Air Force Office of Scientific Research (USAF/AFOSR). The government has certain rights in the invention --

Signed and Sealed this

Twenty-first Day of September, 2004

JON W. DUDAS
*Director of the United States Patent and Trademark Office*